(12) United States Patent
Mabuchi et al.

(10) Patent No.: US 10,483,303 B1
(45) Date of Patent: Nov. 19, 2019

(54) IMAGE SENSOR HAVING MIRROR-SYMMETRICAL PIXEL COLUMNS

(71) Applicant: Omnivision Technologies, Inc., Santa Clara, CA (US)

(72) Inventors: Keiji Mabuchi, Los Altos, CA (US); Sohei Manabe, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 16/179,080

(22) Filed: Nov. 2, 2018

(51) Int. Cl.
  *H01L 31/00* (2006.01)
  *H01L 27/146* (2006.01)
  *H04N 5/378* (2011.01)
  *H04N 5/3745* (2011.01)

(52) U.S. Cl.
  CPC .. *H01L 27/14607* (2013.01); *H01L 27/14645* (2013.01); *H04N 5/378* (2013.01); *H04N 5/3745* (2013.01)

(58) Field of Classification Search
  CPC ........ H01L 27/14607; H01L 27/14645; H04N 5/3745; H04N 5/378
  USPC .......................................................... 257/440
  See application file for complete search history.

(56) References Cited

U.S. PATENT DOCUMENTS 9,165,959 B2 * 10/2015 Chen ................. H01L 27/14605

FOREIGN PATENT DOCUMENTS

JP         2014013794 A      1/2014

* cited by examiner

*Primary Examiner* — Tu-Tu V Ho
(74) *Attorney, Agent, or Firm* — Muncy, Geissler, Olds & Lowe, P.C.

(57) ABSTRACT

An image sensor is provided. The image sensor includes: a first pixel column, including: a first pixel unit; a second pixel unit, vertically adjacent to the first pixel unit; a first column bit line coupled to the first pixel unit, wherein image data acquired by the first pixel unit is read out through the first column bit line; and a second column bit line coupled to the second pixel unit, wherein image data acquired by the second pixel unit is read out through the second column bit line; and a second pixel column horizontally adjacent to the first pixel column, wherein the first pixel column and the second pixel column are mirror-symmetrical with respect to a connection between the pixel units and the column bit lines.

20 Claims, 5 Drawing Sheets

IMAGE SENSOR HAVING MIRROR-SYMMETRICAL PIXEL COLUMNS

BACKGROUND

1. Technical Field

The present disclosure relates generally to image sensors, and in particular but not exclusively, relates to image sensors having pixel columns that are mirror-symmetrical with respect to a connection between pixel units and column bit lines.

2. Description of the Related Art

Nowadays, active pixel image sensors are typically built on either p-type or n-type silicon substrates. Active pixel sensors are sensors having an active circuit element such as an amplifier in, or associated with, each pixel. Complementary metal oxide silicon (CMOS) transistors are transistors in which two transistors composed of opposite dopants (one of p-type and one of n-type) are wired together in a complementary fashion.

Some CMOS image sensors have multiple bit lines per column in order to output multiple signals simultaneously. Such arrangements suffer pixel-to-pixel crosstalk which results from capacitive coupling between the multiple bit lines. Previously, the number of bit lines per column was not much, so the space between the bit lines was relatively large and the coupling effect was neglectable. But these days, some CMOS image sensors have more bit lines causing more severe capacitive coupling effect and pixel-to-pixel crosstalk. Therefore, there exists a need within the art to provide a CMOS image sensor with reduced crosstalk while maintaining all of the current advantages and level of development of existing CMOS image sensors.

SUMMARY

In accordance with an aspect of the present disclosure, an imaging sensor is disclosed. The image sensor includes: a first pixel unit; a second pixel unit, vertically adjacent to the first pixel unit; a third pixel unit, horizontally adjacent to the second pixel unit; a fourth pixel unit, horizontally adjacent to the first pixel unit and vertically adjacent to the third pixel unit, wherein the first, second, third, and fourth pixel units are arranged into a 2×2 array of pixel units; a first column bit line coupled to the first pixel unit, wherein image data acquired by the first pixel unit is read out through the first column bit line; a second column bit line coupled to the second pixel unit, wherein image data acquired by the second pixel unit is read out through the second column bit line; a third column bit line coupled to the third pixel unit, wherein image data acquired by the third pixel unit is read out through the third column bit line, and wherein the second column bit line is between the first column bit line and the third column bit line; and a fourth column bit line coupled to the fourth pixel unit, wherein image data acquired by the fourth pixel unit is read out through the fourth column bit line, and wherein the third column bit line is between the second column bit line and the fourth column bit line.

In accordance with another aspect of the present disclosure, an imaging sensor is disclosed. The image sensor includes: a first pixel column, including: a first pixel unit; a second pixel unit, vertically adjacent to the first pixel unit; a first column bit line coupled to the first pixel unit, wherein image data acquired by the first pixel unit is read out through the first column bit line; a second column bit line coupled to the second pixel unit, wherein image data acquired by the second pixel unit is read out through the second column bit line; and a second pixel column horizontally adjacent to the first pixel column, wherein the first pixel column and the second pixel column are mirror-symmetrical with respect to a connection between the pixel units and the column bit lines.

In accordance with still another aspect of the present disclosure, a first pixel column includes: a first pixel unit, a second pixel unit, a third pixel unit and a fourth pixel unit arranged in this order: the first, second, third and fourth pixel units; a first column bit line coupled to the first pixel unit and the second pixel unit, wherein image data acquired by the first pixel unit or image data acquired by the second pixel unit is selectively read out through the first column bit line; a second column bit line coupled to the third pixel unit and the fourth pixel unit, wherein image data acquired by the third pixel unit or image data acquired by the fourth pixel unit is selectively read out through the second column bit line; and a second pixel column horizontally adjacent to the first pixel column, wherein the first pixel column and the second pixel column are mirror-symmetrical with respect to a connection between the pixel units and the column bit lines.

Figure 1:
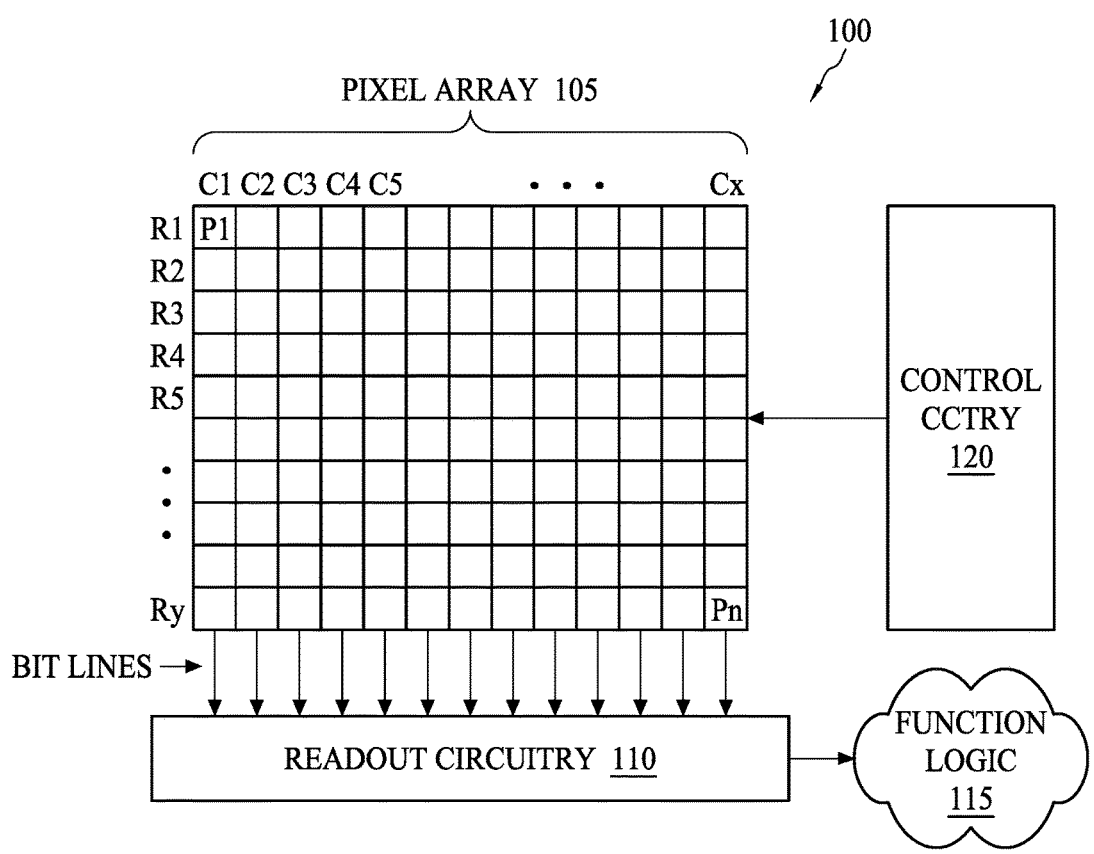
FIG. 1 is a block diagram showing an image sensor in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides many different embodiments or examples for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or the configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" can mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a block diagram showing an image sensor 100 in accordance with some embodiments of the present disclosure. The image sensor 100 includes an active area (i.e., a pixel array 105), readout circuitry 110, a function logic 115, and control circuitry 120. As a non-limiting example, the pixel array 105 may be a two-dimensional array of backside or frontside illuminated imaging pixels or pixel units (e.g., pixel units P1 to Pn). In one embodiment, each pixel unit of the pixel array 105 is an active pixel sensor ("APS"), such as a CMOS imaging pixel. As illustrated, each pixel unit of the pixel array 105 is arranged into a row (e.g., rows R1 to Ry) and a column (e.g., columns C1 to Cx) to acquire image data of a person, place, or object, which can then be used to render an image of the person, place, or object.

After each pixel unit of the pixel array 105 has acquired its image data or image charge, the image data is read out by the readout circuitry 110 through bit lines and transferred to the function logic 115. The readout circuitry 110 may include amplification circuitry, analog-to-digital conversion circuitry, or otherwise. The function logic 115 may simply store the image data or even manipulate the image data by applying post-image processing methods (e.g., crop, rotate, remove red eye, adjust brightness, adjust contrast, etc.). In one embodiment, the readout circuitry 110 may read out one or more rows of image data at a time along readout column lines (illustrated) or may read out the image data using a variety of other techniques (not illustrated), such as a serial readout or a full parallel readout of all pixel units simultaneously.

The control circuitry 120 is coupled to the pixel array 105 to control operational characteristics of the pixel array 105. As a non-limiting example, the control circuitry 120 may generate a shutter signal for controlling image acquisition.

Figure 2:
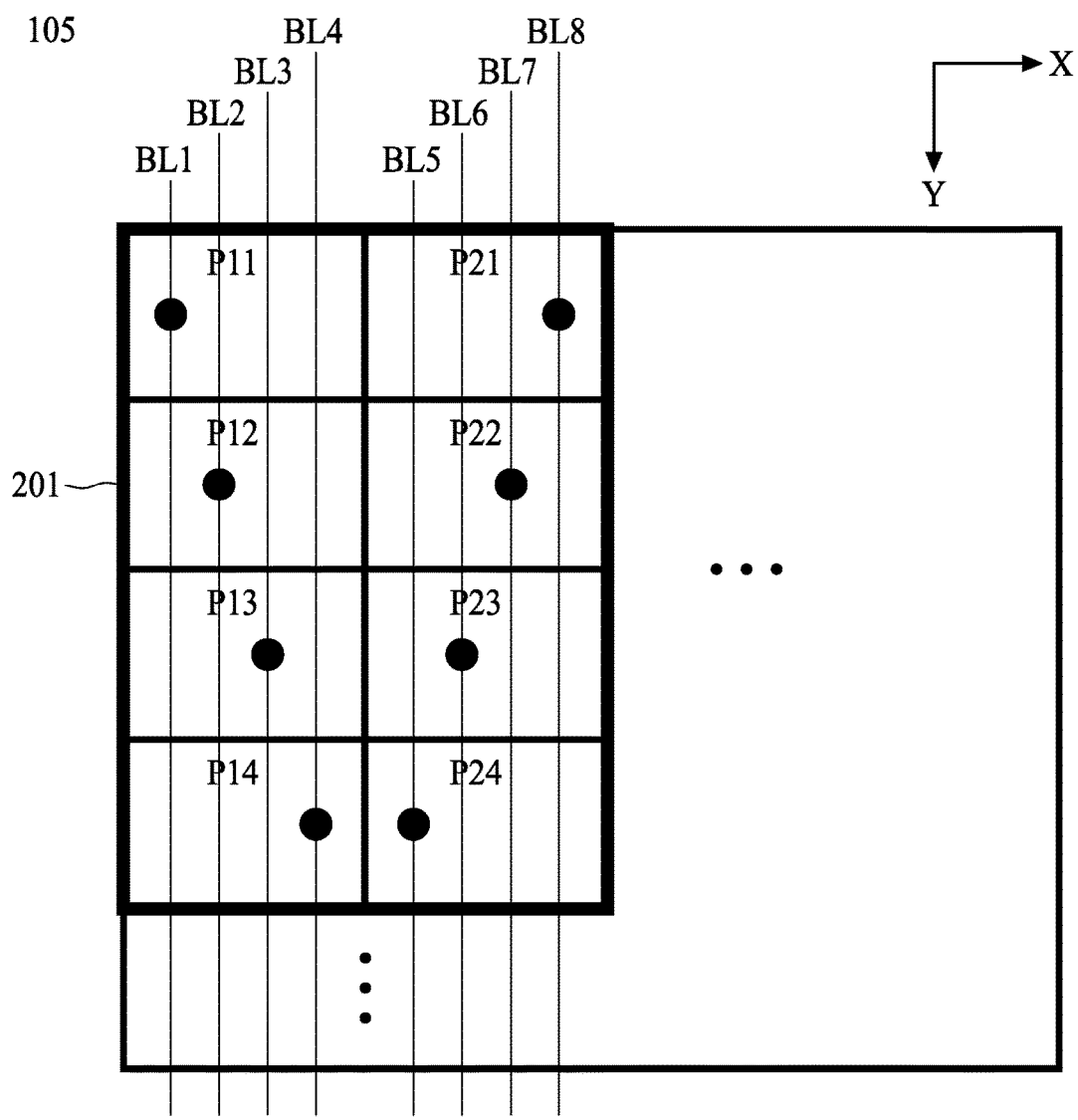
FIG. 2 is a block diagram showing the pixel array and associated configuration of bit lines in accordance with some embodiments of the present disclosure.

FIG. 2 is a block diagram showing the pixel array 105 and associated configuration of bit lines in accordance with some embodiments of the present disclosure. As shown in FIG. 2, the pixel array 105 includes a plurality of pixel subarrays 201 extending along an X axis and a Y axis throughout the pixel array 105. In other words, the pixel subarray 201 is the repeating unit to construct the pixel array 105. The number of the pixel subarrays 201 in the pixel array depends on the size of the pixel array 105 and is not a limitation of the present disclosure.

Each of the pixel subarrays 201 includes a plurality of imaging pixels or pixel units. According to an exemplary embodiment of the present disclosure, each of the pixel subarrays 201 includes two columns of pixel units being mirror-symmetrical with respect to a connection between the pixel units therein and the column bit lines BL1 to BL8, with respect to an interface between the two columns of pixel units. The two columns of pixel units may be horizontally and directly adjacent to each other without being separated by other pixel units. As a non-limiting example, each column of the pixel units includes 4 rows, i.e., 4 pixel units. The left column of pixel units includes pixel units P11, P12, P13 and P14 sequentially and vertically arranged from top to down as illustrated in FIG. 2. The right column of pixel units includes pixel units P21, P22, P23 and P24 sequentially and vertically arranged from top to down as illustrated in FIG. 2. The image data acquired by the 4 rows of each of the pixel subarrays 201 is read out simultaneously through the bit lines BL1 to BL8.

Furthermore, the pixel units P11, P12, P13, P14, P24, P23, P22 and P21 are arranged into a 4×2 array of pixel units. The bit lines BL1 to BL8 are coupled to the pixel units P11, P12, P13, P14, P24, P23, P22 and P21 respectively to allow image data acquired by the pixel units P11, P12, P13, P14, P24, P23, P22 and P21 to be read out through the bit lines BL1 to BL8 respectively. The bit lines BL1 to BL8 are sequentially arranged from left to right as shown in FIG. 2. As mentioned above, the two columns of pixel units are mirror-symmetrical with respect to a connection between the pixel units therein and the column bit lines BL1 to BL8. In particular, the pixel units P11, P12, P22, and P21 may be collectively regarded as a 2×2 array of pixel units being mirror-symmetrical with respect to a connection between the pixel units therein and the column bit lines BL1, BL2, BL7 and BL8; the pixel units P12, P13, P23, and P22 may be collectively regarded as a 2×2 array of pixel units being mirror-symmetrical with respect to a connection between the pixel units therein and the column bit lines BL2, BL3, BL6 and BL7; the pixel units P13, P14, P24, and P23 may be collectively regarded as a 2×2 array of pixel units being mirror-symmetrical with respect to a connection between the pixel units therein and the column bit lines BL3, BL4, BL5 and BL6.

Pixel-to-pixel crosstalk results from capacitive coupling between column bit lines. The number and density of column bit lines can increase due to advanced processes such as pixel level hybrid bonding. However, the crosstalk issue has become more and more serious. Normally, the values of pixel units closer to each other are similar within an image. In other words, the closer the pixel units are to each other, the less likely the values of the pixel units will change abruptly. The mirror-symmetrical arrangement prevents column bit lines that are directly adjacent to each other from being coupled to pixel units that are not directly adjacent to each other. In this way, pixel-to-pixel crosstalk can be mitigated in general cases because the values of the pixel units directly adjacent to each other are normally very similar to each other. As illustrated in FIG. 2, pixel units coupled to column bit lines horizontally and directly adjacent to each other are also directly adjacent to each other vertically or horizontally.

The number of pixel units per pixel subarray 201 is not limited to 8 (i.e., 4×2). As hybrid bond stacking technology evolves, more analog-to-digital converters (ADCs) are allowed to be placed under pixel array and the number of bit lines per pixel column is increased, for example, 8 or 16 for small pixel units, and 32 or more for large pixel units. The mirror-symmetrical arrangement may be applied to pixel subarrays with different sizes and different numbers of column bit lines.

Figure 3:
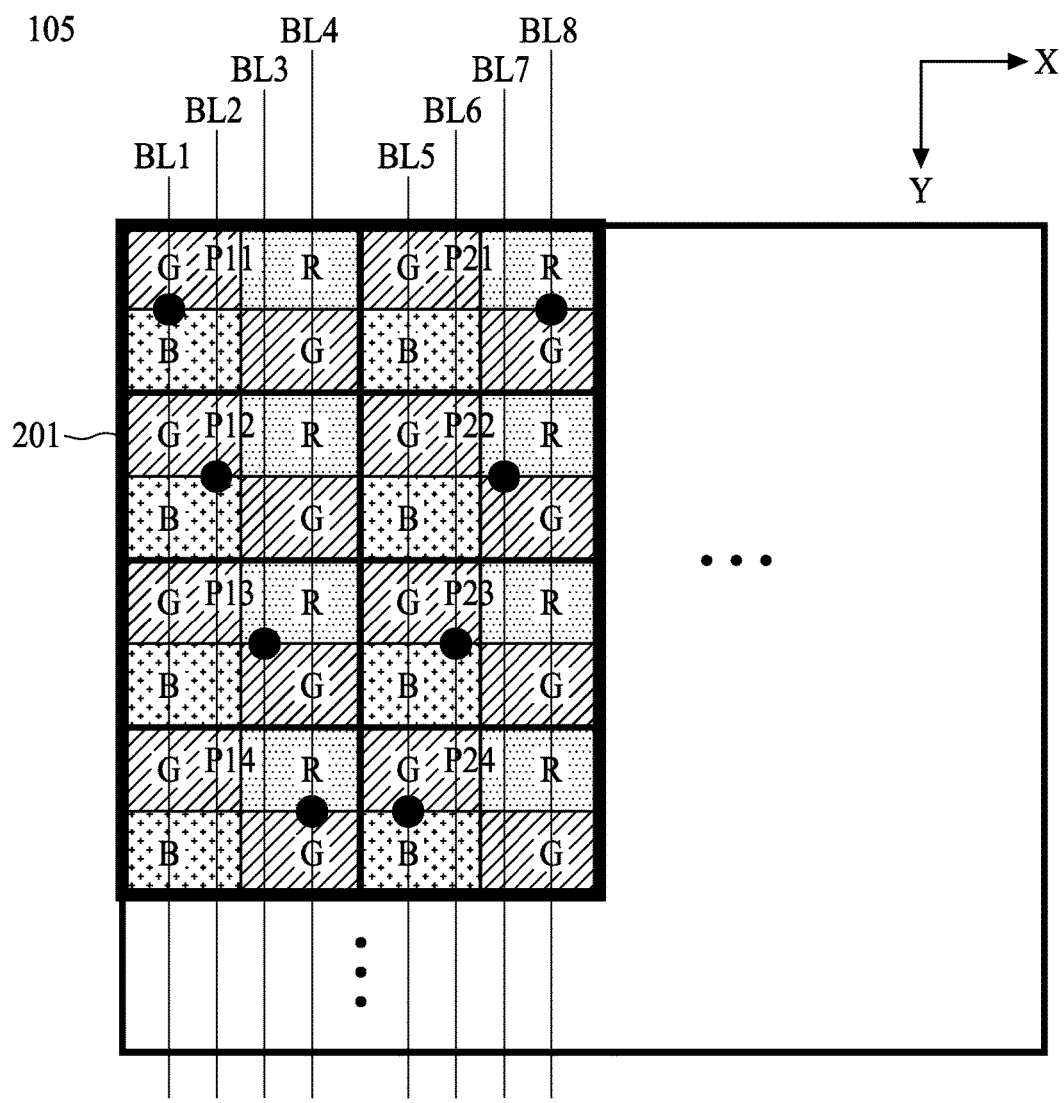
FIG. 3 is a block diagram showing details of the pixel array of FIG. 2 in accordance with some embodiments of the present disclosure.

The pixel array 105 may be monochrome or colored. FIG. 3 is a block diagram showing details of the pixel array 105 of FIG. 2 in accordance with some embodiments of the present disclosure. As shown in FIG. 3, each of the pixel units P11, P12, P13, P14, P21, P22, P23 and P24 may be a shared pixel with photodiodes corresponding to different colors. In particular, the shared pixel may be a four-shared (2×2 based) pixel with four photodiodes arranged according to the Bayer color filter array (CFA) pattern. When operated, the pixel units P11, P12, P13, P14, P21, P22, P23 and P24 are configured to allow one of the four photodiodes therein to be read out simultaneously. For example, the upper-left green (G) pixels of the pixel units P11, P12, P13, P14, P21, P22, P23 and P24 are read out simultaneously through the bit lines BL1 to BL8 at first, and then the upper-right red (R) pixels are read out simultaneously through the bit lines BL1 to BL8. After that, the lower-left blue (B) pixels are read out simultaneously through the bit lines BL1 to BL8, and then the lower-right green (G) pixels are read out simultaneously through the bit lines BL1 to BL8.

It is to be appreciated that the particular CFA pattern and pixel sharing arrangement used in the pixel array 105 as shown in FIG. 3 is exemplary only, and numerous other types of CFA patterns and sharing arrangements may be used.

Figure 4:
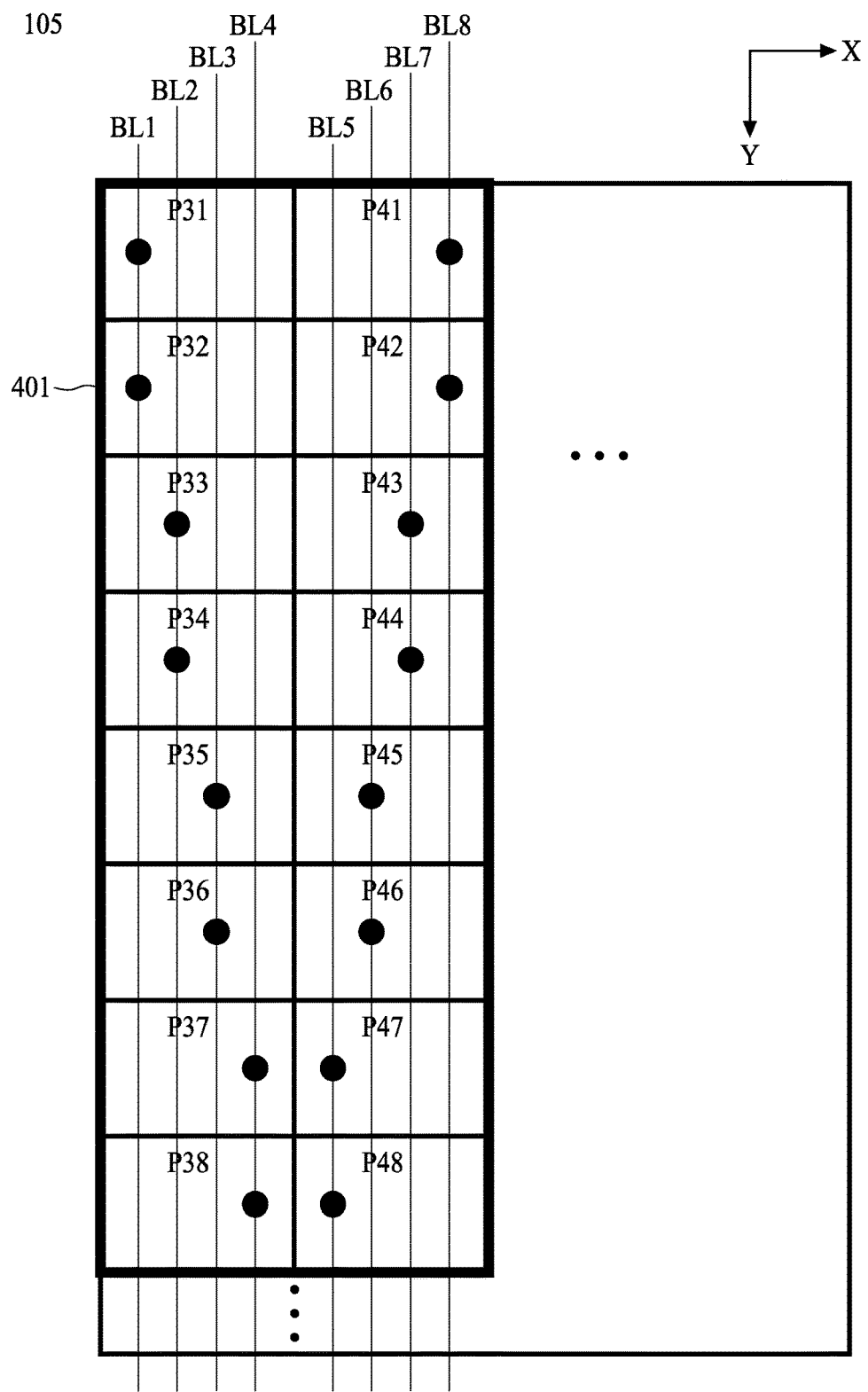
FIG. 4 is a block diagram showing the pixel array and associated configuration of bit lines in accordance with some embodiments of the present disclosure.

FIG. 4 is a block diagram showing the pixel array 105 and associated configuration of bit lines in accordance with some embodiments of the present disclosure. As shown in FIG. 4, the pixel array 105 includes a plurality of pixel subarrays 401 extending along an X axis and a Y axis throughout the pixel array 105. In other words, the pixel subarray 401 is the repeating unit to construct the pixel array 105. The number of the pixel subarrays 401 in the pixel array depends on the size of the pixel array 105 and is not a limitation of the present disclosure.

Each of the pixel subarrays 401 includes a plurality of imaging pixels or pixel units. According to an exemplary embodiment of the present disclosure, each of the pixel subarrays 401 includes two columns of pixel units being mirror-symmetrical with respect to a connection between the pixel units therein and the column bit lines BL1 to BL8, with respect to an interface between the two columns of pixel units. The two columns of pixel units may be horizontally and directly adjacent to each other without being separated by other pixel units. As a non-limiting example, each column of pixel units includes 8 rows, i.e., 8 pixel units. The left column of pixel units includes the pixel units P31, P32, P33, P34, P35, P36, P37, and P38 sequentially and vertically arranged from top to down as illustrated in FIG. 4. The right column of pixel units includes the pixel units P41, P42, P43, P44, P45, P46, P47, and P48 sequentially and vertically arranged from top to down as illustrated in FIG. 4.

The image data acquired by 4 of the 8 rows of the left column and that acquired by 4 of the 8 rows of the right column are read out simultaneously through the bit lines BL1 to BL8. Further, the pixel units P31, P32, P33, P34, P35, P36, P37, P38, P41, P42, P43, P44, P45, P46, P47, and P48 are arranged into an 8×2 array of pixel units. The bit line BL1 is coupled to the pixel units P31 and P32 to allow image data acquired by the pixel units P31 or P32 to be read out through the bit line BL1. The bit line BL2 is coupled to the pixel units P33 and P34 to allow image data acquired by the pixel units P33 and P34 to be read out through the bit line BL2. The bit line BL3 is coupled to the pixel units P35 and P36 to allow image data acquired by the pixel units P35 and P36 to be read out through the bit line BL3. The bit line BL4 is coupled to the pixel units P37 and P38 to allow image data acquired by the pixel units P37 and P38 to be read out through the bit line BL4. The bit line BL5 is coupled to the pixel units P41 and P42 to allow image data acquired by the pixel units P41 or P42 to be read out through the bit line BL5. The bit line BL6 is coupled to the pixel units P43 and P44 to allow image data acquired by the pixel units P43 and P44 to be read out through the bit line BL6. The bit line BL7 is coupled to the pixel units P45 and P46 to allow image data acquired by the pixel units P45 or P46 to be read out through the bit line BL7. The bit line BL8 is coupled to the pixel units P47 and P48 to allow image data acquired by the pixel units P47 or P48 to be read out through the bit line BL8.

In some embodiments, the image data acquired by the pixel units P31, P33, P35, P37, P48, P46, P44 and P42 is read out simultaneously through the bit lines BL1 to BL8, and after that, the image data acquired by the pixel units P32, P34, P36, P38, P47, P45, P43 and P41 is read out simultaneously through the bit lines BL1 to BL8. However, this is not a limitation of the present disclosure. In some embodiments, the image data acquired by the pixel units P32, P34, P36, P38, P47, P45, P43 and P41 is read out simultaneously through the bit lines BL1 to BL8, and after that, the image data acquired by the pixel units P31, P33, P35, P37, P48, P46, P44 and P42 is read out simultaneously through bit lines BL1 to BL8. In some embodiments, the image data acquired by the pixel units P31, P33, P35, P37, P47, P45, P43 and P41 is read out simultaneously through the bit lines BL1 to BL8, and after that, the image data acquired by the pixel units P32, P34, P36, P38, P48, P46, P44 and P42 is read out simultaneously through the bit lines BL1 to BL8. In some embodiments, the image data acquired by the pixel units P32, P34, P36, P38, P48, P46, P44 and P42 is read out simultaneously through the bit lines BL1 to BL8, and after that, the image data acquired by the pixel units P31, P33, P35, P37, P47, P45, P43 and P41 is read out simultaneously through the bit lines BL1 to BL8.

The bit lines BL1 to BL8 are sequentially arranged from left to right as shown in FIG. 4. As mentioned above, the two columns of pixel units are mirror-symmetrical with respect to a connection between the pixel units therein and the column bit lines BL1 to BL8. In particular, the pixel units P31, P32, P42, and P41 may be collectively regarded as a 2×2 array of pixel units being mirror-symmetrical with respect to a connection between the pixel units therein and the column bit lines BL1 and BL8; the pixel units P32, P33, P43, and P42 may be collectively regarded as a 2×2 array of pixel units being mirror-symmetrical with respect to a connection between the pixel units therein and the column bit lines BL1, BL2, BL7 and BL8; the pixel units P33, P34, P44, and P43 may be collectively regarded as a 2×2 array of pixel units being mirror-symmetrical with respect to a connection between the pixel units therein and the column bit lines BL2 and BL7; the pixel units P34, P35, P45, and P44 may be collectively regarded as a 2×2 array of pixel units being mirror-symmetrical with respect to a connection between the pixel units therein and the column bit lines BL2, BL3, BL6 and BL7; the pixel units P35, P36, P46, and P45 may be collectively regarded as a 2×2 array of pixel units being mirror-symmetrical with respect to a connection between the pixel units therein and the column bit lines BL3 and BL6; the pixel units P36, P37, P47, and P46 may be collectively regarded as a 2×2 array of pixel units being mirror-symmetrical with respect to a connection between the pixel units therein and the column bit lines BL3, BL4, BL5 and BL6; the pixel units P37, P38, P48, and P47 may be collectively regarded as a 2×2 array of pixel units being mirror-symmetrical with respect to a connection between the pixel units therein and the column bit lines BL4 and BL5.

The mirror-symmetrical arrangement of FIG. 4 allows pixel units coupled to column bit lines that are directly adjacent to each other to be as closer to one another as possible. In this way, pixel-to-pixel crosstalk can be mitigated in general cases because the values of pixel units close to each other are normally similar to each other. As illustrated in FIG. 4, pixel units coupled to column bit lines horizontally and directly adjacent to each other are at most separated by one pixel unit.

The number of pixel units per pixel subarray 401 is not limited to 16 (i.e. 4×2). As hybrid bond stacking technology evolves, more analog-to-digital converters (ADCs) are allowed to be placed under a pixel array and the number of bit lines per pixel column is increased, for example, 16 or 32 for small pixel units, and 64 or more for large pixel units. The mirror-symmetrical arrangement may be applied to pixel subarrays with different sizes and different numbers of column bit lines.

Figure 5:
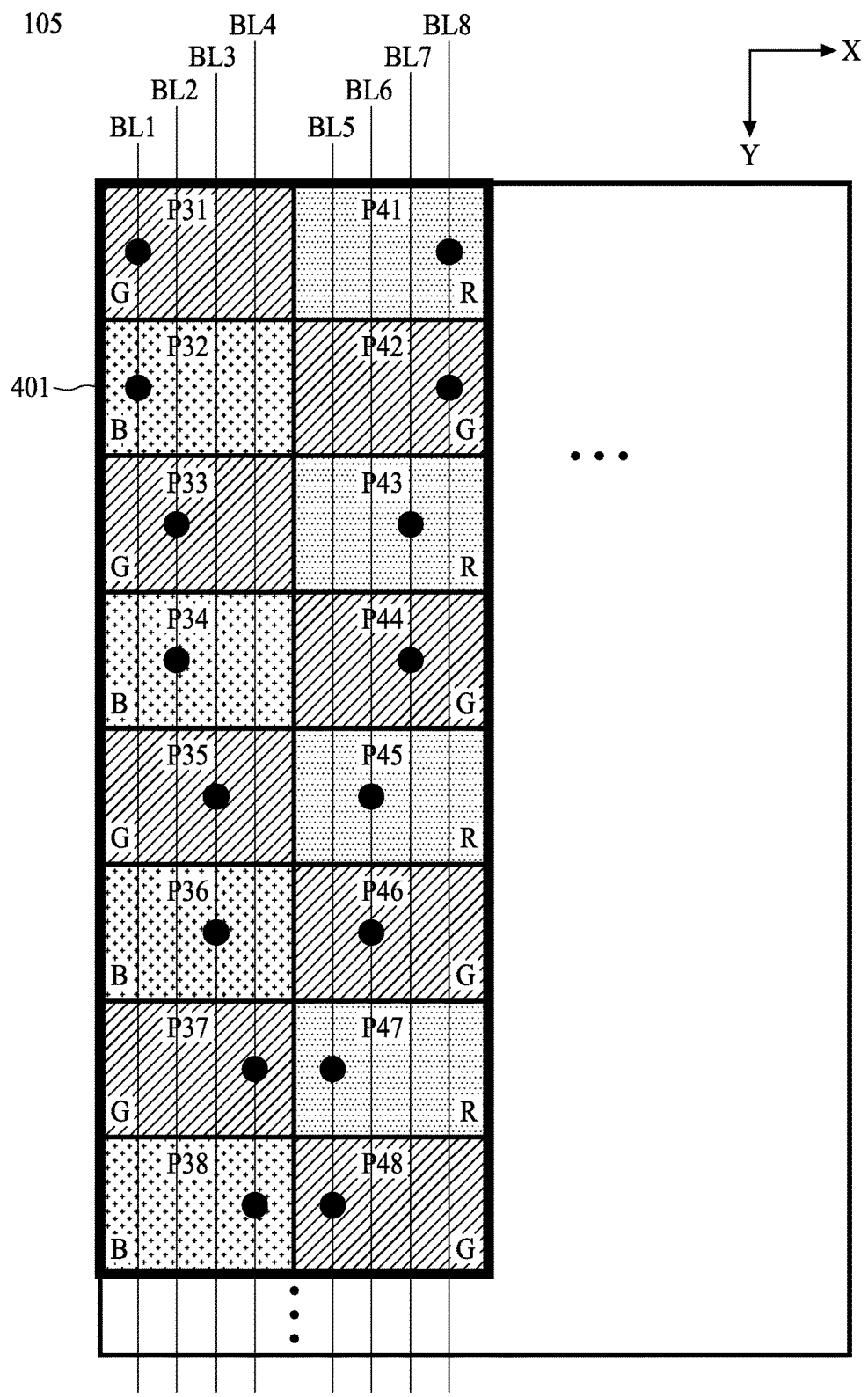
FIG. 5 is a block diagram showing details of the pixel array pf FIG. 4 in accordance with some embodiments of the present disclosure.

The pixel array 105 may be monochrome or colored. FIG. 5 is a block diagram showing details of the pixel array 105 of FIG. 4 in accordance with some embodiments of the present disclosure. As shown in FIG. 5, each of the pixel units P31, P32, P33, P34, P35, P36, P37, P38, P41, P42, P43, P44, P45, P46, P47, and P48 may be a single color pixel unit. As a non-limiting example, the pixel units P31, P32, P33, P34, P35, P36, P37, P38, P41, P42, P43, P44, P45, P46, P47, and P48 are arranged based on the Bayer CFA pattern. For example, the pixel units P31, P33, P35, P37, P42, P44, P46 and P48 are green (G) pixels; the pixel units P32, P34, P36, and P38 are blue (B) pixels; and the pixel units P41, P43, P45, and P47 are red (R) pixels.

According to some embodiments, the green (G) pixels P31, P33, P35, P37, P42, P44, P46 and P48 are read out simultaneously through the bit lines BL1 to BL8 at first, and then the blue (B) pixels P32, P34, P36, and P38 and the red (R) pixels P41, P43, P45, and P47 are read out simultaneously through the bit lines BL1 to BL8. However, this is not a limitation of the present disclosure. In some embodiments, the blue (B) pixels P32, P34, P36, and P38 and the red (R) pixels P41, P43, P45, and P47 are read out simultaneously through the bit lines BL1 to BL8 at first, and then the green (G) pixels P31, P33, P35, P37, P42, P44, P46 and P48 are read out simultaneously through the bit lines BL1 to BL8.

It is to be appreciated that the particular CFA pattern used in the pixel array 105 as shown in FIG. 5 is exemplary only, and numerous other types of CFA patterns may be used.

In accordance with some embodiments of the present disclosure, an imaging sensor is disclosed. The image sensor includes: a first pixel unit; a second pixel unit, vertically adjacent to the first pixel unit; a third pixel unit, horizontally adjacent to the second pixel unit; a fourth pixel unit, horizontally adjacent to the first pixel unit and vertically adjacent to the third pixel unit, wherein the first, second, third, and fourth pixel units are arranged into a 2×2 array of pixel units; a first column bit line coupled to the first pixel unit, wherein image data acquired by the first pixel unit is read out through the first column bit line; a second column bit line coupled to the second pixel unit, wherein image data acquired by the second pixel unit is read out through the second column bit line; a third column bit line coupled to the third pixel unit, wherein image data acquired by the third pixel unit is read out through the third column bit line, and wherein the second column bit line is between the first column bit line and the third column bit line; and a fourth column bit line coupled to the fourth pixel unit, wherein image data acquired by the fourth pixel unit is read out through the fourth column bit line, and wherein the third column bit line is between the second column bit line and the fourth column bit line.

In accordance some embodiments of the present disclosure, an imaging sensor is disclosed. The image sensor includes: a first pixel column, including: a first pixel unit; a second pixel unit, vertically adjacent to the first pixel unit; a first column bit line coupled to the first pixel unit, wherein image data acquired by the first pixel unit is read out through the first column bit line; and a second column bit line coupled to the second pixel unit, wherein image data acquired by the second pixel unit is read out through the second column bit line; and a second pixel column horizontally adjacent to the first pixel column, wherein the first pixel column and the second pixel column are mirror-symmetrical with respect to a connection between the pixel units and the column bit lines.

In accordance some embodiments of the present disclosure, a first pixel column, including: a first pixel unit, a second pixel unit, a third pixel unit and a fourth pixel unit arranged in this order: the first, second, third and fourth pixel units; a first column bit line coupled to the first pixel unit and the second pixel unit, wherein image data acquired by the first pixel unit or image data acquired by the second pixel unit is selectively read out through the first column bit line; a second column bit line coupled to the third pixel unit and the fourth pixel unit, wherein image data acquired by the third pixel unit or image data acquired by the fourth pixel unit is selectively read out through the second column bit line; and a second pixel column horizontally adjacent to the first pixel column, wherein the first pixel column and the second pixel column are mirror-symmetrical with respect to a connection between pixel units and column bit lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising
a first pixel unit;
a second pixel unit, vertically adjacent to the first pixel unit;
a third pixel unit, horizontally adjacent to the second pixel unit;
a fourth pixel unit, horizontally adjacent to the first pixel unit and vertically adjacent to the third pixel unit, wherein the first, second, third, and fourth pixel units are arranged into a 2×2 array of pixel units;
a first column bit line coupled to the first pixel unit, wherein image data acquired by the first pixel unit is read out through the first column bit line;
a second column bit line coupled to the second pixel unit, wherein image data acquired by the second pixel unit is read out through the second column bit line;
a third column bit line coupled to the third pixel unit, wherein image data acquired by the third pixel unit is read out through the third column bit line, and wherein the second column bit line is between the first column bit line and the third column bit line; and
a fourth column bit line coupled to the fourth pixel unit, wherein image data acquired by the fourth pixel unit is read out through the fourth column bit line, and wherein the third column bit line is between the second column bit line and the fourth column bit line.

2. The image sensor of claim 1, wherein the first, second, third, and fourth column bit lines are configured to allow the image data acquired by the first, the second, third, and fourth pixel units to be read out simultaneously.

3. The image sensor of claim 1, wherein each of the first, second, third, and fourth pixel units includes a 2×2 based shared pixel.

4. The image sensor of claim 3, wherein each of the 2×2 based shared pixels includes 4 photodiodes and a shared floating diffusion region.

5. The image sensor of claim 4, wherein the first, second, third, and fourth column bit lines are configured to allow the image data acquired by one of the photodiodes of each of the 2×2 based shared pixels to be read out simultaneously.

6. The image sensor of claim 4, wherein each of the 2×2 based shared pixels includes the 4 photodiodes arranged in a Bayer pattern.

7. The image sensor of claim 6, wherein the first, second, third, and fourth column bit lines are configured to allow the image data acquired by the same color of the photodiodes of each of the 2×2 based shared pixels to be read out simultaneously.

8. An image sensor, comprising
a first pixel column, including:
a first pixel unit;
a second pixel unit, vertically adjacent to the first pixel unit;
a first column bit line coupled to the first pixel unit, wherein image data acquired by the first pixel unit is read out through the first column bit line; and
a second column bit line coupled to the second pixel unit, wherein image data acquired by the second pixel unit is read out through the second column bit line; and
a second pixel column horizontally adjacent to the first pixel column, wherein the first pixel column and the second pixel column are mirror-symmetrical with respect to a connection between the pixel units and the column bit lines.

9. The image sensor of claim 8, wherein the first pixel column and the second pixel column are mirror-symmetrical with respect to an interface between the first pixel column and the second pixel column.

10. The image sensor of claim 8, wherein the first, second, third, and fourth column bit lines are configured to allow the image data acquired by the first pixel column and the second pixel column to be read out simultaneously.

11. The image sensor of claim 8, wherein each of the first and second pixel units includes a 2×2 based shared pixel.

12. The image sensor of claim 11, wherein each of the 2×2 based shared pixels includes 1 red (R) pixel, 1 blue (B) pixel, and 2 green (G) pixels.

13. The image sensor of claim 8, wherein the first pixel column further includes:
a third pixel unit, vertically adjacent to the first pixel unit;
a fourth pixel unit, vertically adjacent to the third pixel unit, wherein the first, second, third and fourth pixel units are arranged in an order of the fourth, third, first and second pixel units;
a third column bit line coupled to the third pixel unit, wherein image data acquired by the third pixel unit is read out through the third column bit line; and
a fourth column bit line coupled to the fourth pixel unit, wherein image data acquired by the fourth pixel unit is read out through the fourth column bit line.

14. The image sensor of claim 13, wherein the first, second, third, and fourth column bit lines are arranged in an order of the fourth, third, first, and second column bit lines.

15. An image sensor, comprising
a first pixel column, including:
a first pixel unit, a second pixel unit, a third pixel unit and a fourth pixel unit arranged in an order of the first, second, third and fourth pixel units;
a first column bit line coupled to the first pixel unit and the second pixel unit, wherein image data acquired by the first pixel unit or image data acquired by the second pixel unit is selectively read out through the first column bit line; and
a second column bit line coupled to the third pixel unit and the fourth pixel unit, wherein image data acquired by the third pixel unit or image data acquired by the fourth pixel unit is selectively read out through the second column bit line; and
a second pixel column horizontally adjacent to the first pixel column, wherein the first pixel column and the second pixel column are mirror-symmetrical with respect to a connection between the pixel units and the column bit lines.

16. The image sensor of claim 15, wherein the first pixel column and the second pixel column are mirror-symmetrical with respect to an interface between the first pixel column and the second pixel column.

17. The image sensor of claim 15, wherein the first, second, third, and fourth pixel units are single color pixel units.

18. The image sensor of claim 17, wherein the first and third pixel units are single color pixel units of a first color, and the second and fourth pixel units are single color pixel units of a second color different from the first color.

19. The image sensor of claim 15, wherein the first and second column bit lines are configured to selectively allow the image data acquired by the first and third pixel units to be read out simultaneously, or the image data acquired by the second and fourth pixel units to be read out simultaneously.

20. The image sensor of claim 15, wherein the second pixel column includes:
   a fifth pixel unit, a sixth pixel unit, a seventh pixel unit, and an eighth pixel unit arranged in an order of the fifth, sixth, seventh, and eighth pixel units;
   a third column bit line coupled to the fifth pixel unit and the sixth pixel unit, wherein image data acquired by the fifth pixel unit or image data acquired by the sixth pixel unit is selectively read out through the third column bit line; and
   a fourth column bit line coupled to the seventh pixel unit and the eighth pixel unit, wherein image data acquired by the seventh pixel unit or image data acquired by the eighth pixel unit is selectively read out through the fourth column bit line.

* * * * *